United States Patent
Choi et al.

(10) Patent No.: US 9,874,795 B2
(45) Date of Patent: Jan. 23, 2018

(54) ARRAY SUBSTRATE, MANUFACTURING METHOD, AND DISPLAY DEVICE THEREOF

(71) Applicant: BOE TECHNOLOGY GROUP CO., LTD., Beijing (CN)

(72) Inventors: Hyun Sic Choi, Beijing (CN); Hui Li, Beijing (CN); Zhiqiang Xu, Beijing (CN); Yoon Sung Um, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 55 days.

(21) Appl. No.: 14/372,395

(22) PCT Filed: Dec. 12, 2013

(86) PCT No.: PCT/CN2013/089271
§ 371 (c)(1),
(2) Date: Jul. 15, 2014

(87) PCT Pub. No.: WO2014/190727
PCT Pub. Date: Dec. 4, 2014

(65) Prior Publication Data
US 2015/0309377 A1     Oct. 29, 2015

(30) Foreign Application Priority Data

May 30, 2013 (CN) .......................... 2013 1 0210409

(51) Int. Cl.
*G02F 1/1362* (2006.01)
*G02F 1/1335* (2006.01)
(Continued)

(52) U.S. Cl.
CPC ...... *G02F 1/136209* (2013.01); *G02F 1/1343* (2013.01); *G02F 1/1368* (2013.01);
(Continued)

(58) Field of Classification Search
CPC ........................................... G02F 2001/136222
See application file for complete search history.

(56) References Cited

U.S. PATENT DOCUMENTS

| | | | |
|---|---|---|---|
| 6,958,799 B2 | 10/2005 | Tomioka et al. | |
| 2002/0101557 A1* | 8/2002 | Ono | G02F 1/134363 349/143 |

(Continued)

FOREIGN PATENT DOCUMENTS

| | | |
|---|---|---|
| CN | 1369731 A | 9/2002 |
| CN | 1373390 A | 10/2002 |

(Continued)

OTHER PUBLICATIONS

Written Opinion of the International Searching Authority of PCT/CN2013/089271 in English, dated Mar. 20, 2014.

(Continued)

*Primary Examiner* — Sang V Nguyen
(74) *Attorney, Agent, or Firm* — Collard & Roe, P.C.

(57) ABSTRACT

An array substrate includes a substrate (10), a plurality of pixel regions (30) and a black matrix (15) separating the pixel regions (30) formed on the substrate (10); corresponding to a region where the black matrix (15) is located, the substrate (10) is provided with a thin film transistor. The pixel region (30) includes a first electrode (17) and a second electrode (20) configured for generating an electric field therebetween to drive liquid crystals. The second electrode (20) is disposed above the first electrode (17). The pixel region (30) further includes a color resist layer (16) disposed between a gate insulation layer (12) and the second electrode (20) and distributed in the pixel region (30). A method of manufacturing the array substrate and a display device are further disclosed.

14 Claims, 3 Drawing Sheets

(51) Int. Cl.
*H01L 51/52* (2006.01)
*G02F 1/1368* (2006.01)
*H01L 27/12* (2006.01)
*G02F 1/1343* (2006.01)
*H01L 27/32* (2006.01)

(52) U.S. Cl.
CPC .. *G02F 1/133514* (2013.01); *G02F 1/134309* (2013.01); *H01L 27/124* (2013.01); *H01L 27/1259* (2013.01); *H01L 51/5262* (2013.01); *G02F 2001/134372* (2013.01); *G02F 2001/136222* (2013.01); *H01L 27/3244* (2013.01)

(56) References Cited

U.S. PATENT DOCUMENTS

| | | | | |
|---|---|---|---|---|
| 2004/0109098 | A1* | 6/2004 | Kim | G02F 1/133514 349/38 |
| 2004/0179157 | A1* | 9/2004 | Kim | G02F 1/1333 349/114 |
| 2010/0134710 | A1* | 6/2010 | Ishitani | G02F 1/133514 349/46 |
| 2010/0151606 | A1* | 6/2010 | Kim | G02F 1/134336 438/30 |
| 2010/0165277 | A1* | 7/2010 | Hwang | G02F 1/1337 349/123 |
| 2010/0210052 | A1 | 8/2010 | Kim | |
| 2011/0134353 | A1* | 6/2011 | Kimura | G02F 1/134363 349/46 |
| 2012/0281172 | A1* | 11/2012 | Park | G02F 1/133707 349/123 |
| 2013/0335664 | A1* | 12/2013 | Shim | G02F 1/1339 349/43 |
| 2014/0054581 | A1* | 2/2014 | Song | G02F 1/1343 257/43 |
| 2014/0104527 | A1* | 4/2014 | Yang | H01L 27/1225 349/43 |

FOREIGN PATENT DOCUMENTS

| | | |
|---|---|---|
| CN | 1567077 A | 1/2005 |
| CN | 102681276 A | 9/2012 |
| CN | 102929058 A | 2/2013 |
| CN | 202855737 U | 4/2013 |
| CN | 103309081 A | 9/2013 |
| CN | 203259747 U | 10/2013 |
| JP | 2000098368 A | 4/2000 |
| WO | 2010/002194 A2 | 1/2010 |

OTHER PUBLICATIONS

Second Chinese Office Action of Chinese Application No. 201310210409.1, dated Sep. 9, 2015 with English translation.
English Translation of the International Search Report of PCT/CN2013/089271 published in English dated Dec. 4, 2014.
Chinese Office Action of Chinese Application No. 201310210409.1, dated Mar. 24, 2015 with English translation.
International Search Report, International Preliminary Report on Patentability and Written Opinion of the International Searching Authority of PCT/CN2013/089271 in Chinese, dated Mar. 20, 2014.
Third Chinese Office Action of Chinese Application No. 201310210409.1, dated Feb. 19, 2016 with English translation.
Fourth Chinese Office Action of Chinese Application No. 201310210409.1, dated Jun. 22, 2016 with English translation.

\* cited by examiner

ARRAY SUBSTRATE, MANUFACTURING METHOD, AND DISPLAY DEVICE THEREOF

CROSS REFERENCE TO RELATED APPLICATIONS

This application is the National Stage of PCT/CN2013/089271 filed on Dec. 12, 2013, which claims priority under 35 U.S.C. §119 of Chinese Application No. 201310210409.1 filed on May 30, 2013, the disclosure of which is incorporated by reference.

TECHNICAL FIELD

Embodiments of the invention relate to a field of display technology, in particular an array substrate, a manufacturing method, and a display device thereof.

BACKGROUND

Nowadays, the liquid crystal display has replaced the traditional cathode ray tube display and widely used in various display fields such as household, public places, office place and personal electronics products, because of its advantages of light weight, low power consumption, low radiation and saving large space etc.

In fabrication process of a known liquid crystal panel, the array substrate and the color filter substrate are separately manufactured, and then aligned and assembled into a cell. However, when the array substrate and the color filter substrate are aligned and assembled, it is more prone to appear an alignment deviation due to the restrictions of alignment precision, and the alignment deviation will result in light leakage and make light transmittance low, etc. In addition, if the black matrix is fabricated to be wide enough to avoid these problems, the panel transmittance will be reduced and the backlight cost will be increased.

SUMMARY

Embodiments of the invention provide an array substrate, a manufacturing method, and a display device thereof, which can reduce the influence of alignment deviation between the array substrate and the color filter on the light transmittance and avoid the light leakage caused by alignment deviation.

According to a first aspect of the present invention, there is provided an array substrate comprising: a substrate, a plurality of pixel regions and a black matrix separating the pixel regions formed on the substrate; corresponding to a region where the black matrix is located, the substrate is provided with a thin film transistor comprising a gate insulating layer; the pixel region comprises a first electrode and a second electrode configured for generating an electric field therebetween to drive liquid crystals, the second electrode is disposed above the first electrode, the pixel region further comprises:

a color resist layer disposed between the gate insulation layer and the second electrode and distributed in the pixel region.

According to a second aspect of the present invention, there is provided a display device comprising the mentioned array substrate.

According to a third aspect of the present invention, there is provided a method of manufacturing an array substrate, comprising:

forming a gate electrode on a substrate;

forming a thin film transistor above the gate electrode, the thin film transistor comprising a gate insulating layer;

forming a black matrix above the thin film transistor, the substrate being separated into a plurality of pixel regions by the black matrix;

forming a color resist layer and a first electrode in the pixel regions;

forming a resin layer on the substrate formed with the color resist layer and the first electrode;

forming a passivation layer on the resin layer; and forming a second electrode above the passivation layer in the pixel regions, such that the color resist layer is located between the gate insulation layer and the second electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

LIST OF REFERENCE NUMBERS 10,10'—substrate; 11,11'—gate electrode; 12,12'—gate insulation layer; 13,13'—semiconductor layer; 14,14'—source/drain electrode; 142,142'—data line; 15—black matrix; 16—color resist layer; 17,17'—pixel electrode; 18,18'—resin layer; 19,19'—passivation layer; 20, 20'—common electrode; 21'—common electrode line, 30—pixel region.

DETAILED DESCRIPTION

In order to make objects, technical details and advantages of the embodiments of the invention more apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide an array substrate, a manufacturing method, and a display device thereof, which can reduce the influence of alignment deviation between the array substrate and the color filter substrate on the light transmittance and avoid the light leakage caused by alignment deviation.

Embodiment 1

The embodiment of the present invention provides an array substrate, the array substrate comprises: a substrate, a plurality of pixel regions and a black matrix separating the pixel regions formed on the substrate. The substrate is provided with a thin film transistor having a gate insulating layer at a position corresponding to the region where the black matrix is formed. The pixel region comprises a first electrode and a second electrode configured for generating an electric field to drive liquid crystals. The second electrode is disposed above the first electrode. The pixel region further comprises:

a color resist layer, which is disposed between the gate insulation layer and the second electrode and distributed in the pixel region.

In this embodiment, the thin film transistor comprises a gate electrode, the gate insulation layer, a semiconductor layer and a source/drain electrode. In this embodiment, the first electrode and the second electrode refer to a pixel electrode and a common electrode respectively, or vice versa. For example, if one of the electrodes (e.g. the first electrode) is the pixel electrode, then the other one of the electrodes (e.g. the second electrode) is the common electrode. The pixel electrode is connected with the drain electrode of the thin film transistor directly (or by a via hole). The loading of display data is controlled by the thin film transistor when the display device is in operation.

In this embodiment, the color resist layer refers to a red/green/blue primary color filter layer formed in the pixel region. In this embodiment, the color resist layer is disposed on the array substrate, for example, the color resist layer is located between the gate insulation layer and the second electrode (or the second electrode layer, 2nd ITO) and in the pixel region, which can reduce the influence of alignment deviation between the array substrate and the color filter substrate on the light transmittance.

Further, the black matrix may be disposed on the source/drain electrode and overlay the thin film transistor.

Further, an ohmic contact layer may be disposed between the semiconductor layer and the source/drain electrode, which aims to reduce the contact resistance between the semiconductor layer and the source/drain electrode. The semiconductor layer and the ohmic contact layer form a semiconductor active layer.

In this embodiment, the black matrix overlays the thin film transistor, and the color resist layer is distributed in one of the pixel regions (i.e. the pixel regions are defined by a group of transversal gate lines and a group of longitudinal data lines, the thin film transistor is located in intersection of the gate line and the data line). The array substrate of this embodiment is provided with the color resist layer and the black matrix, and thus the influence of alignment deviation between the array substrate and the color filter substrate on the light transmittance can be reduced, meanwhile the light leakage caused by alignment deviation can also be avoided.

Figure 1:
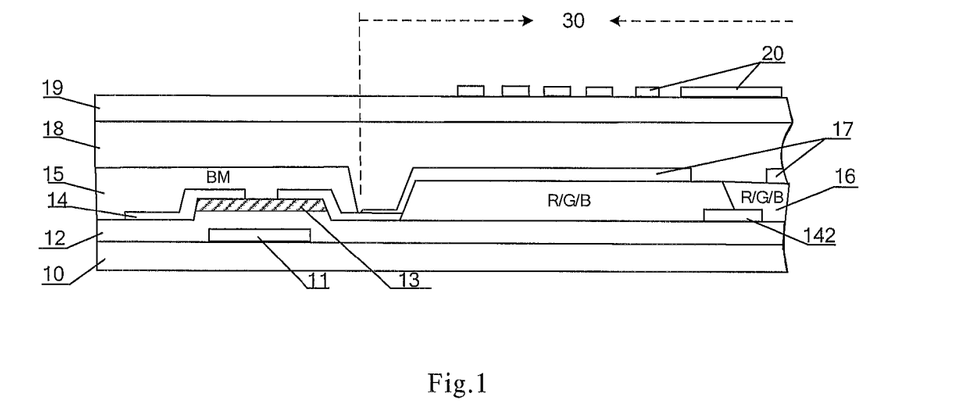
FIG. 1 is a structural schematic view of a first array substrate according to an example of the present invention.

FIG. 1 illustrates an example of the first array substrate, which comprises:

A substrate 10; a plurality of pixel regions 30 and a black matrix 15 separating the pixel regions formed on the substrate 10. A gate electrode 11, a gate insulation layer 12, a semiconductor layer 13 and a source/drain electrode 14 are disposed on the substrate 10 and correspond to the region where the black matrix (BM) 15 is formed. The first electrode (pixel electrode 17) and the second electrode (common electrode 20) configured for generating an electric field to drive the liquid crystal are disposed in the pixel region 30, and the second electrode (common electrode 20) is disposed above the first electrode (pixel electrode 17). In the pixel region 30, a patterned color resist layer 16 is disposed between the gate insulation layer 12 and the pixel electrode 17. The color resist layer 16 comprises a red filter layer, a green filter layer and a blue filter layer disposed adjacent to each other. In other examples, the color resist layer 16 further comprises a yellow filter layer or a white filter layer. The color resist layer 16 may be disposed above the source/drain electrode, thus the process of forming the source/drain electrode is followed by the process of forming the color resist layer 16.

In this example, the gate electrode 11, the gate insulating layer 12, the semiconductor layer 13 and the source/drain electrode 14 disposed on the substrate 10 together form the thin film transistor of a bottom-gate structure. The gate electrode 11 is formed by a gate metal layer, and the gate metal layer may also form the pattern of gate lines; the source/drain electrode 14 is formed by a source/drain metal layer, and the source/drain metal layer may also form the pattern of data line 142.

In this example, for example, the black matrix is disposed on the source/drain electrode 14 and overlays the thin film transistor. The pixel electrode 17 is disposed on the color resist layer 16 and connected to the drain electrode of the thin film transistor. A resin layer 18 overlays both the black matrix 15 and the pixel electrode 17. A passivation layer 19 overlays the resin layer 18. For example, the common electrode 20 is a slit-shaped transparent electrode and disposed on the passivation layer 19 in the pixel region 30.

The array substrate provided in FIG. 1 may be applicable to an Advanced Super Dimension Switching (AD-SDS or ADS) mode, wherein the color resist layer and the black matrix originally located on the color filter substrate are disposed on the array substrate, such that the influence of alignment deviation between the array substrate and the color filter substrate on the light transmittance can be reduced and the light leakage caused by alignment deviation can be avoided. In this embodiment, the black matrix 15 is disposed on the source/drain electrode 14 and overlays the thin film transistor, and the color barrier layer 16 is disposed in the pixel region and located between the gate insulating layer 12 and the pixel electrode 17. For example, the color resist layer 16 is made of an insulating material, which can reduce a parasitic capacitance between the data line and the first electrode.

Figure 2:
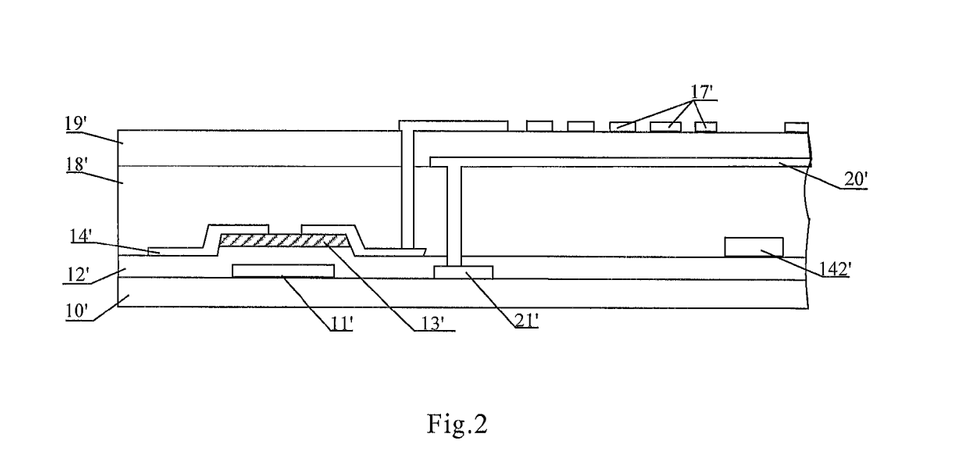
FIG. 2 is a schematic structural view of a known ADS type array substrate.

The technological characteristics of the above-mentioned ADS type are: a multi-dimensional electric field is formed by both of an electric field produced at edges of slit electrodes in the same plane and an electric field produced between a slit electrode layer and a plate-shaped electrode layer, so that liquid crystal molecules at all directions, which are located directly over the electrodes and between the slit electrodes in a liquid crystal cell, can be rotated, which enhances the work efficiency of liquid crystals and increases light transmittance. ADS technology can improve the picture quality of thin film transistor liquid crystal displays (TFT-LCD) and has advantages of high resolution, high light transmittance, low power consumption, wide viewing angle, high aperture ratio, low chromatic aberration, being free of push Mura, etc. A known ADS type array substrate as illustrated in FIG. 2 comprises: a substrate 10'; a gate electrode 11', a gate insulating layer 12', semiconductor layer 13', a source/drain electrode 14', a resin layer 18' disposed on the substrate 10'; a common electrode 20' disposed on the resin layer 18'; a passivation layer 19' disposed on the common electrode 20' and a pixel electrode 17' disposed on the passivation layer 19'. The data line 142' and the source/drain electrode 14' are located in the same layer, the common electrode line 21' and the gate electrode 11' are located in the same layer, the pixel electrode 17' is connected to the drain electrode of the thin film transistor by a via hole, the common electrode 20' is connected to the common electrode line 21' by a via hole. In addition, in the known ADS type display device, both the color resist layer and the black matrix are located on the color filter substrate.

In this example, the source/drain metal layer, besides forming the source/drain electrode of the thin film transistor, may further simultaneously form the data line 142 and common electrode line (not shown in FIG. 1), and the gate line may be simultaneously formed when forming the gate electrode 11 of the thin film transistor. The transversal gate line and the longitudinal data line are intersected with each other to define the pixel region 30.

The color resist layer 16 is located in the pixel region 30, and the color resist layer 16 comprises several primary color blocks, i.e., red/green/blue primary color blocks. The pixel region comprises a plurality of sub-pixel regions, each of the primary color blocks is distributed in one of the sub-pixel regions.

In known technology, a black matrix is further disposed between the two adjacent color blocks in order to prevent an undesirable color mixing. However, in this example, because the position of the data line 142 as illustrated in FIG. 1 corresponds to a boundary region of any two of the primary color blocks in the color resist layer 16, it does not require any additional black matrix to be disposed above the data line 142 in accordance with the following principle: the pixel electrode 17 above the data line 142 is located on both sides of the data line 142 respectively, and the common electrode 20 above the data line 142 completely overlays the region where the data line 142 is located, such that the common electrode 20 can shield interference from the electric field generated between the data line 142 and the common electrode 20, and the liquid crystal molecules near the data line 142 cannot be interfered and thus the light leakage can be avoided.

When the line width of the data line is narrower, the two adjacent primary color blocks may be stacked as a laminated structure; in this case, the amount of transmitted light can be reduced after passing through the primary color block twice. When the line width of the data line is wider, the data line may serve as the black matrix between the two adjacent color blocks without using the stacked primary color blocks, thus, the color mixing and light leakage are avoided, the shielding area of the black matrix is reduced and the pixel aperture ratio is increased. In another example in which it is not sensitive to the light transmittance, the black matrix may be further disposed on the data line to further avoid the color mixing and the light leakage.

The gate line (not shown) is typically disposed at the position that is shielded by the black matrix. The common electrode line (not shown) may be longitudinally arranged in parallel with the data line, and similar to the data line, the common electrode line may overlay or not overlay the black matrix; the common electrode line may also be laterally arranged in parallel with the gate line, and similar to the gate line, the common electrode line may be disposed at the position shield by the black matrix.

Therefore, in the ADS substrate with the black matrix and the color resist layer according to the present example, it is not required to dispose the black matrix at the position corresponding to the signal line (data line), and the black matrix only overlays the thin film transistor, thereby reducing the shield area of the black matrix and improving the light transmittance and brightness of the display device.

Figure 3:
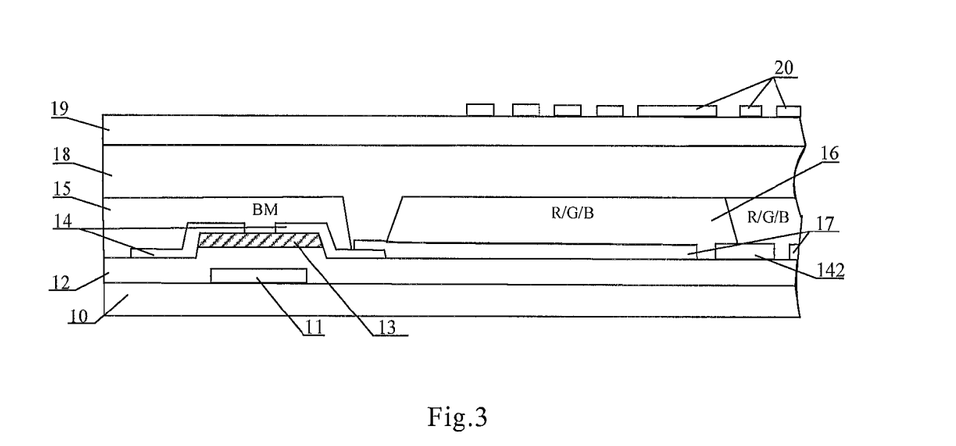
FIG. 3 is a structural schematic view of a second array substrate according to another example of the present invention.
Figure 4:
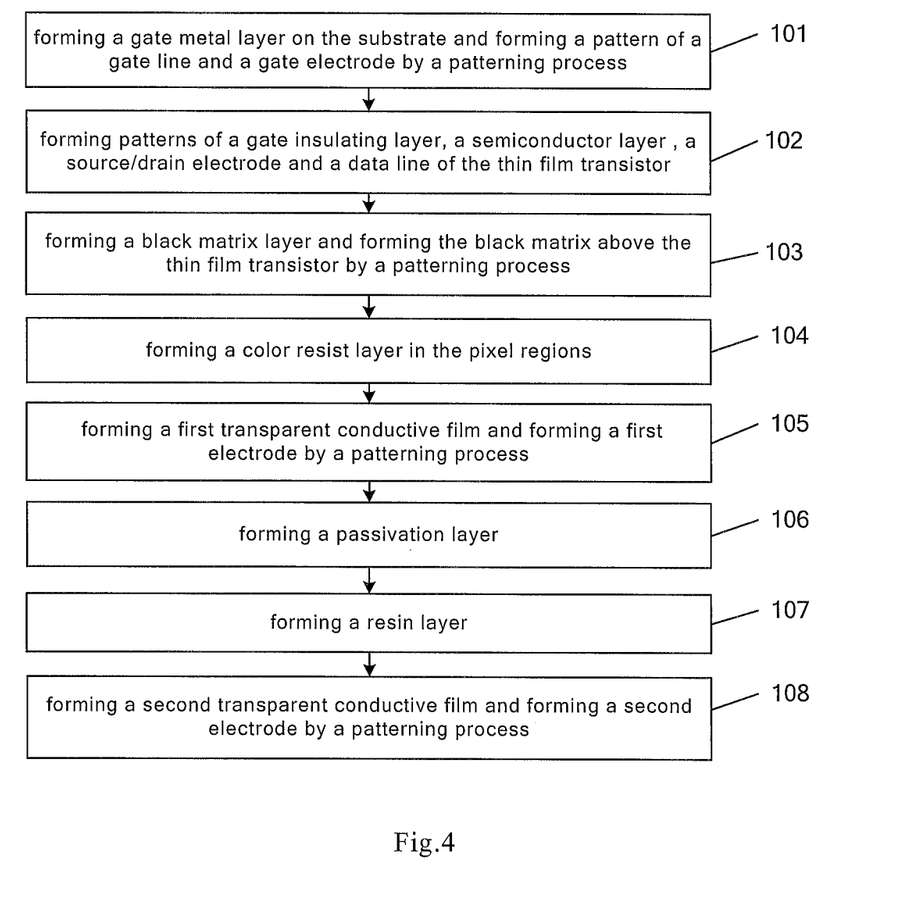
FIG. 4 is a flow chart of a manufacturing method of an array substrate according to Embodiment 3 of the present invention.

FIG. 3 illustrates an example of the second array substrate, which is different from the first array substrate in that the color resist layer 16 is located on the pixel electrode 17 and beneath the common electrode 20.

In this example, the black matrix 15 is disposed on the source/drain electrode 14, and overlays the thin film transistor; the resin layer 18 is disposed on both the black matrix 15 and the color resist layer 16; the passivation layer 19 is disposed on the resin layer 18; the common electrode 20 is disposed on the passivation layer 19 in the pixel region. The pixel electrode 17 and the data line 142 are located in the same layer.

In this example, the pixel electrode 17 and the drain electrode are directly lap jointed with each other to avoid disconnecting. The common electrode 20 being disposed above the data line 142 can shield the influence of the data line 142 on the electric field, decrease Cst and improve the light transmittance. The array substrate of this example is provided with the color resist layer and the black matrix, and thus the influence of alignment deviation between the array substrate and the color filter substrate on the light transmittance can be reduced and the light leakage caused by alignment deviation can be avoided. Furthermore, reducing the influence of alignment deviation on the light transmittance can lower the requirements of positioning accuracy, thereby reducing the shielding area of the black matrix and improving the light transmittance and brightness of the display device.

In the two examples as mentioned above, the thin film transistor may also adopt a top gate structure, i.e. the gate insulating layer and the gate metal layer thereon are located on the semiconductor layer, and the structure of remaining film layers is substantially similar and is not discussed herein.

Embodiment 2

The embodiment of the present invention further provides a display device comprising any one of the array substrates mentioned in the embodiment 1. The display device may be selected from: liquid crystal panel, E-paper, OLED panel, mobile phone, tablet PC, television, display, notebook computer, digital picture frame, navigator and any other product or part with display function.

The display device of the present embodiment can reduce the influence of alignment deviation between the array substrate and the color filter substrate on the light transmittance by using the array substrate with the color resist layer and the black matrix, and thus the shielding area of the black matrix can be reduced and the light transmittance and brightness of the display device can be improved.

Embodiment 3

The embodiment of the present invention provides a manufacturing method of an array substrate. The manufacturing method comprises:

forming a gate electrode on a substrate;

forming a thin film transistor above the gate electrode, the thin film transistor comprising a gate insulation layer;

forming a black matrix above the thin film transistor, the substrate being separated into a plurality of pixel regions by the black matrix;

forming a color resist layer and a first electrode in the pixel regions;

forming a resin layer on the substrate formed with the color resist layer and the first electrode;

forming a passivation layer on the resin layer; and forming a second electrode above the passivation layer in the pixel regions, such that the color resist layer is located between the gate insulation layer and the second electrode.

Further, the step of forming the color resist layer and the first electrode in the pixel regions comprises:

forming the color resist layer on the gate insulating layer in the pixel regions first, and then forming the first electrode on the color resist layer.

Further, the step of forming the color resist layer and the first electrode in the pixel regions comprises:

forming the first electrode on the gate insulating layer in the pixel regions first, and then forming the color resist layer on the first electrode.

Figure 5:
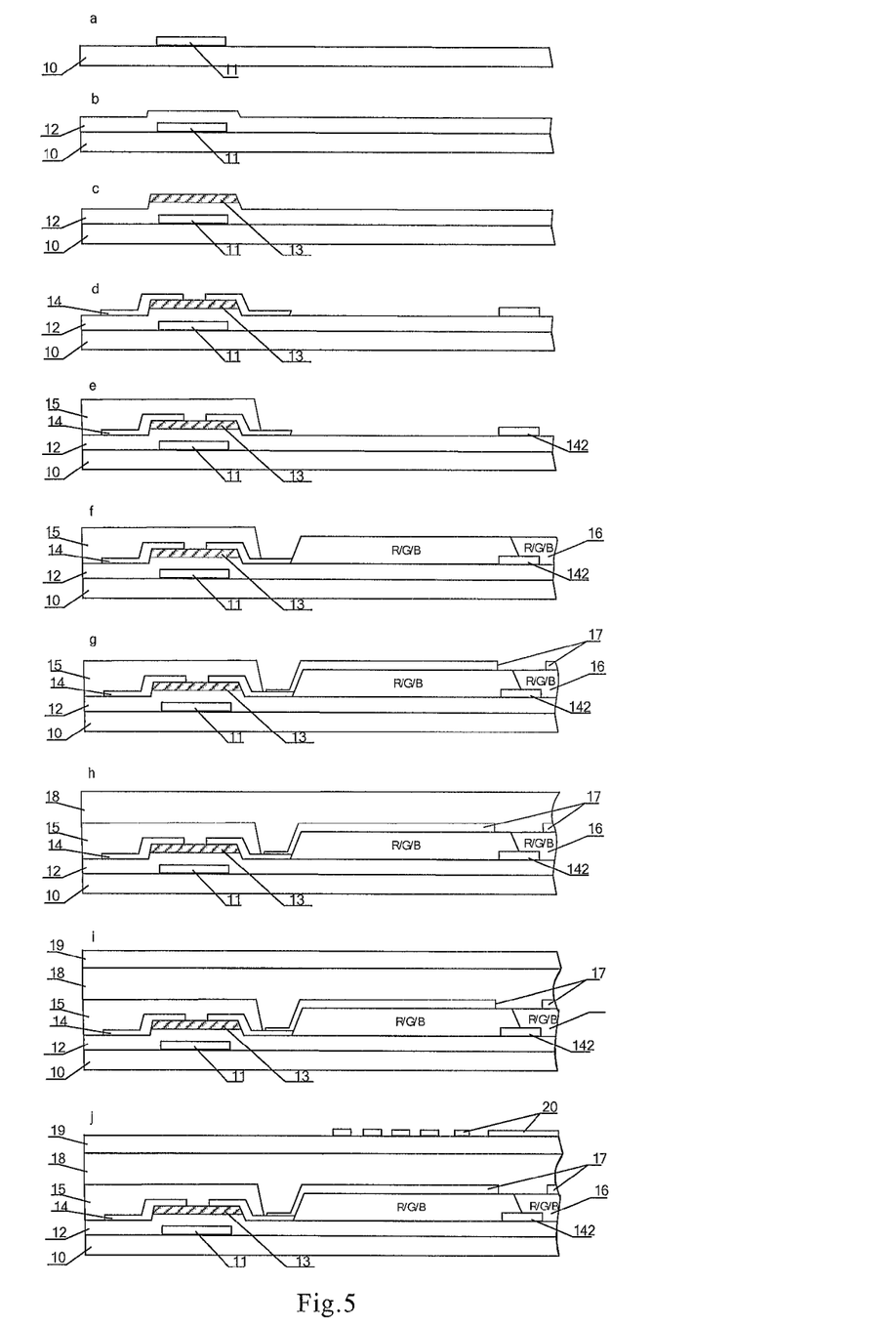
FIGS. 5a-5j are cross-sectional views of an array substrate in the manufacturing method according to Embodiment 3 of the present invention.

As illustrated in FIGS. 4 and 5a-5j, there is provided an example of the manufacturing method of the first array substrate, the manufacturing method comprises:

Step 101, forming a gate metal layer on the substrate 10 and forming a pattern of a gate line and a gate electrode by a patterning process (FIG. 5a);

For example, in this step, the gate metal layer is first deposited on the substrate 10 by a film-forming method such as magnetron sputtering or thermal evaporation, wherein the material of the gate metal layer comprises at least one of molybdenum, aluminum, chromium or copper.

The patterning process in the embodiment refers to the whole photolithography process for fabricating a pattern on the substrate, which comprises steps of coating photoresist, exposure under a mask, developing, etching and so on, also known as a mask process.

Step 102, forming patterns of a gate insulating layer 12, a semiconductor layer 13, a source/drain electrode 14 and a data line 142 of the thin film transistor on the substrate after step 101 (FIGS. 5b-5d);

In this step, the patterns of the gate insulating layer 22, the semiconductor layer 23, the source/drain electrode 14 and the data line 142 may be formed by a known process. For example, the patterning process is typically used 2-3 times. The first patterning process is used for forming a gate insulating layer (the patterning process may also not be used), the second patterning process is used for forming a pattern of the semiconductor layer 23, and the third patterning process is used for forming a pattern comprising a source electrode, a drain electrode and the data line 142.

Step 103, forming a black matrix layer on the substrate after step 102, and forming the black matrix 15 above the thin film transistor by a patterning process, the substrate is separated into a plurality of pixel regions by the black matrix (FIG. 5e);

The black matrix formed in this step overlays the thin film transistor, and it may further overlay or not overlay the signal line according to design requirements such as line width, etc (referring to Embodiment 1 for details).

Step 104, forming the color resist layer 16 in the pixel regions on the substrate after step 103 (FIG. 5f);

In this step, the color resist layer 16 is formed in the region corresponding to the pixel electrode 17, e.g. by forming a color filter layer color-block through coating, thus the color filter layer color-block may be formed using any known process in the art. Generally speaking, an ordinary red/green/blue (RGB) color filter is formed by three patterning processes. Besides, there are also other different color filter designs such as RGBW (red/green/blue/white) color filter and RGBY (red/green/blue/yellow) color filter, which may be set as required.

For example, for forming the ordinary red/green/blue block (RGB) color filter, both color-photoresist coating process and patterning process need to be performed repeatedly. The first primary color block (e.g. red) is formed after the first performance, the second primary color block (e.g. green) is formed after the second performance, the third primary color block (e.g. blue) is formed after the third performance, finally the three primary color blocks are successively arranged, and each of the primary color blocks is distributed in one sub-pixel region.

Step 105, forming a first transparent conductive film on the substrate after step 104, and forming a first electrode (e.g. the pixel electrode 17) in the pixel regions by a patterning process (FIG. 5g);

For example, the transparent conductive film is made of such materials as indium tin oxide (ITO), indium zinc oxide (IZO), or aluminum zinc oxide and so on. The first electrode may be a slit-shaped electrode or plate-shaped electrode according to the product requirements.

Step 106, forming the resin layer 18 on the substrate after step 105 (FIG. 5h);

The resin layer 18 is formed in this step. If the structure as illustrated in FIG. 1 is formed, i.e., when the first electrode is a pixel electrode 17, the second electrode is a common electrode 20, and the common electrode line and the common electrode are located in the same layer, no via holes needs to be formed in both the passivation layer 19 and resin layer 18. Therefore, this step does not require using a mask process. In other examples, when the positions of the pixel electrode 17 and the common electrode 20 are reversed, i.e., the first electrode is the common electrode 20 and the second electrode is the pixel electrode 17, it is necessary for the common electrode 20 to pass through both the resin layer 18 and the gate insulating layer 12 so as to connect with the common electrode line. In this case, the resin layer 18 should be provided with a via hole for connecting drain electrode and a via hole for connecting common electrode line, thus in this step, it is necessary to form the resin layer as well as the via hole for connecting drain electrode and the via hole for connecting the common electrode line through the resin layer by a patterning process.

Step 107, forming a passivation layer 19 on the substrate after step 106; in this step, the patterning process may not be used (FIG. 5i);

The passivation layer is formed in this step. If the structure as illustrated in FIG. 1 is formed, i.e., when the first electrode is a pixel electrode 17, the second electrode is a common electrode 20, and the common electrode line and the common electrode are located in the same layer, it is necessary to form via holes in peripheral wire region by a patterning process, such that the gate signal line and the data signal line can be exposed. For example, a gate leading line via hole (not shown) passing through the passivation layer 19, the resin layer 18 and the gate insulating layer 12 needs to be formed, and a data leading line via hole (not shown) passing through the passivation layer 19 and the resin layer 18 needs to be formed in peripheral wire region. In other examples, when the positions of the pixel electrode 17 and the common electrode 20 are reversed, i.e., the first electrode is the common electrode 20, the second electrode is the pixel electrode 17, it is necessary for the pixel electrode 17 to pass through the passivation layer 19 and the resin layer 18 so as to connect with the drain electrode of the thin film transistor, thus, a via hole connecting drain electrode and passing through the passivation layer and the resin layer needs to be formed, and in this case, the patterning process is needed in this step.

Step 108, forming a second transparent conductive film on the substrate after step 107, and forming the second electrode (e.g., the common electrode 20) by a patterning process (FIG. 5j); the second electrode is a slit-shaped electrode so as to form a multi dimensional electric field.

In the method of manufacturing an array substrate provided in this example, the preparations of the black matrix and the color resist in the fabricating procedure of color filter substrate are transferred into the fabricating procedure of the array substrate, but the times of patterning process is not additionally increased, thus, the fabricating process is simple. As the fabricated array substrate is provided with the color resist layer and the black matrix, the influence of alignment deviation between the array substrate and the color filter substrate on the light transmittance can be reduced, such that the shielding area of the black matrix can be reduced and the light transmittance and brightness of the display device can be improved.

Referring to FIG. 3, an example of the manufacturing method of the second array substrate is further provided, the method comprises:

Step 1, forming a gate metal layer on the substrate 10, and forming a pattern of a gate line and a gate electrode 11 by a patterning process;

Step 2, forming patterns of a gate insulating layer 12, a semiconductor layer 13, a source/drain electrode 14 and a data line 142 of the thin film transistor;

Step 3, forming a black matrix layer, and forming the black matrix 15 above the thin film transistor by a patterning process;

Step 4, forming a first transparent conductive film, and forming a first electrode (e.g., the pixel electrode 17) on the gate insulating layer in the pixel regions by a patterning process;

Step 5, forming a color resist layer 16 on the first electrode in the pixel regions;

Step 6, forming a resin layer 18 on both the black matrix 15 and the color resist layer 16;

Step 7, forming a passivation layer 19 on the resin layer 18;

Step 8, forming a second transparent conductive film, and forming a second electrode (e.g., the common electrode 20) on the passivation layer 19 in the pixel regions.

In another example, when positions of the common electrode 17 and the pixel electrode 20 as illustrated in FIG. 3 are reversed, the above step 6 further comprises: forming a via hole for connecting common electrode line by a patterning process, the via hole passing through the resin layer 18 and the gate insulating layer 12; the above step 7 further comprises: forming a via hole for connecting drain electrode by a patterning process, the via hole passing through the passivation layer 19 and the resin layer 18.

In the method of manufacturing an array substrate provided in this example, the preparations of the black matrix process and the color resist in the fabricating procedure of color filter substrate are transferred into the fabricating procedure of the array substrate, but the times of patterning process is not additionally increased. As the fabricated array substrate is provided with the color resist layer and the black matrix, the influence of alignment deviation between the array substrate and the color filter substrate on the light transmittance can be reduced, such that the shielding area of the black matrix can be reduced and the light transmittance and brightness of the display device can be improved.

It is noted that, in the embodiments of the present invention, the sequence number of the steps is not intended to limit the sequence of steps. One skilled in the art would appreciate that changes of the sequence of steps are also within the protection scope of the present invention, e.g., in the manufacturing method of the first array substrate, step 103 and step 104 may also be exchanged, i.e. forming the color resist layer in the pixel regions first, and then forming the black matrix 15 above the thin film transistor.

In addition, in other embodiments of the present invention, the positions of the pixel electrode 17 and the common electrode 20 both in FIGS. 1 and 3 may be reversed. In this case, in order to keep the pixel electrode 17 and the drain electrode of the thin film transistor in connection with each other, and keep the common electrode 20 and the common electrode line in connection with each other, it is necessary to form a corresponding via hole passing through the resin layer 18, the passivation layer 19 and the gate insulating layer, the specific formation process is described as above.

What are described above is related to the illustrative embodiments of the disclosure only and not limitative to the scope of the disclosure; the scopes of the disclosure are defined by the accompanying claims.

The invention claimed is:

1. An array substrate, comprising: a substrate, a plurality of pixel regions and a black matrix separating the pixel regions formed on the substrate; corresponding to a region where the black matrix is located, the substrate is provided with a thin film transistor comprising a gate insulating layer; the pixel region comprises a first electrode and a second electrode configured for generating an electric field therebetween to drive liquid crystals, the second electrode is disposed above the first electrode, the pixel region further comprises:

a color resist layer disposed between the first electrode and the second electrode and distributed in the pixel region, and the color resist layer is in direct contact with the first electrode, and the first electrode is a pixel electrode, the second electrode is a common electrode which is connected to a common line formed in the same layer with a gate electrode layer;

wherein the thin film transistor further comprises a source and a drain electrode, the black matrix is disposed above the source and the drain electrode of the thin film transistor, the black matrix together with the first electrode completely overlay the thin film transistor, the black matrix is in direct contact with both the source electrode and the drain electrode between which an interval is provided, and the black matrix and the color resist layer are sequentially arranged in a direction parallel to the substrate, and the source electrode or the drain electrode, which is connected with the pixel electrode, comprises a portion which does not overlap both the black matrix and the color resist layer in a direction perpendicular to the substrate;

further comprising: a resin layer overlaying the black matrix, the color resist layer and the first electrode; a passivation layer overlaying the resin layer; the second electrode is disposed on the passivation layer.

2. The array substrate according to claim 1, wherein the second electrode is a slit-shaped transparent electrode and disposed on the passivation layer.

3. The array substrate according to claim 1, wherein the color resist layer comprises a plurality of primary color blocks, and the pixel region comprises a plurality of sub-pixel regions, each of the primary color blocks is distributed in one of the sub-pixel regions.

4. The array substrate according to claim 3, further comprising:

a data line located in a same layer as the source and the drain electrode, wherein a position of the data line corresponds to a boundary region of any two of the primary color blocks in the color resist layer.

5. The array substrate according to claim 1, wherein the thin film transistor further comprises a gate electrode, the array substrate further comprises:

a gate line disposed in the same layer as the gate electrode, the gate line being disposed in a shielding region of the black matrix.

6. A display device, comprising the array substrate according to claim 1.

7. The array substrate according to claim 1, wherein the color resist layer does not overlap the black matrix in the direction perpendicular to the substrate.

8. The array substrate according to claim 1, wherein the thin film transistor further comprises a semiconductor layer, and the color resist layer does not overlap the semiconductor layer in the direction perpendicular to the substrate.

9. The array substrate according to claim 1, wherein the black matrix does not overlap both the first electrode and the second electrode in the direction perpendicular to the substrate.

10. The array substrate according to claim 1, wherein the black matrix does not overlap the pixel electrode in the direction perpendicular to the substrate.

11. The array substrate according to claim 1, wherein both the entire first electrode and the entire second electrode are transparent.

12. The array substrate according to claim 1, comprising a data line, wherein the data line does not overlap the black matrix in the direction perpendicular to the substrate.

13. An array substrate, comprising:

a substrate, a plurality of pixel regions and a black matrix separating the pixel regions formed on the substrate;

wherein corresponding to a region where the black matrix is located, the substrate is provided with a thin film transistor comprising a gate insulating layer;

the pixel region comprises a first electrode and a second electrode configured for generating an electric field therebetween to drive liquid crystals, the second electrode is disposed above the first electrode, and the first electrode is a pixel electrode, the second electrode is a common electrode which is connected to a common line formed in the same layer with a gate electrode layer;

the pixel region further comprises: a color resist layer disposed between the gate insulation layer and the second electrode and distributed in the pixel region, and a resin layer overlaying the black matrix, the color resist layer and the first electrode, wherein the black matrix does not overlap both the first electrode and the second electrode in a direction perpendicular to the substrate.

14. The array substrate according to claim 13, wherein the black matrix and the color resist layer are sequentially arranged in a direction parallel to the substrate, one of the first electrode and the second electrode is a pixel electrode, and the source electrode or the drain electrode, which is connected with the pixel electrode, comprises a portion which does not overlap both the black matrix and the color resist layer in the direction perpendicular to the substrate.

* * * * *